United States Patent [19]

Ohashi et al.

[11] Patent Number: 5,019,856
[45] Date of Patent: May 28, 1991

[54] IMAGE FORMING APPARATUS

[75] Inventors: Kunio Ohashi; Shoichi Nagata, both of Nara, Japan

[73] Assignee: Sharp Kabushiki Kaisha, Osaka, Japan

[21] Appl. No.: 299,032

[22] Filed: Jan. 23, 1989

[30] Foreign Application Priority Data

Jan. 22, 1988 [JP] Japan .................................. 63-13349

[51] Int. Cl.$^5$ ............................................. G03B 27/32
[52] U.S. Cl. .................................................... 355/27
[58] Field of Search ..................... 355/27, 28, 32, 205, 355/206, 207, 209, 50; 430/138

[56] References Cited

U.S. PATENT DOCUMENTS 4,809,049 2/1989 Okuzawa et al. ..................... 355/28
4,908,655 3/1990 Tagaki ..................................... 355/50

Primary Examiner—L. T. Hix
Assistant Examiner—Khanh Dang
Attorney, Agent, or Firm—Flehr, Hohbach, Test, Albritton & Herbert

[57] ABSTRACT

An image forming apparatus stores inside a light-shielding container a photosensitive sheet having a surface coated with microcapsules encapsulating a light-curable agent and a colorless dye. After this photosensitive sheet is pulled out of the container and exposed to image-forming light to form a latent image thereon, an image transfer sheet having one surface coated with a developing agent having an chromogenic effect on the encapsulated colorless dye is superposed on the photosensitive sheet and pressed together to selectively rupture unhardened ones of the microcapsules. After a jam detected inside the apparatus is removed, double exposure of the microcapsules is prevented by advancing the photosensitive sheet by an appropriate distance depending on whether exterior light is detected by sensors inside the apparatus and whether the jam occurred during an image forming operation.

4 Claims, 3 Drawing Sheets

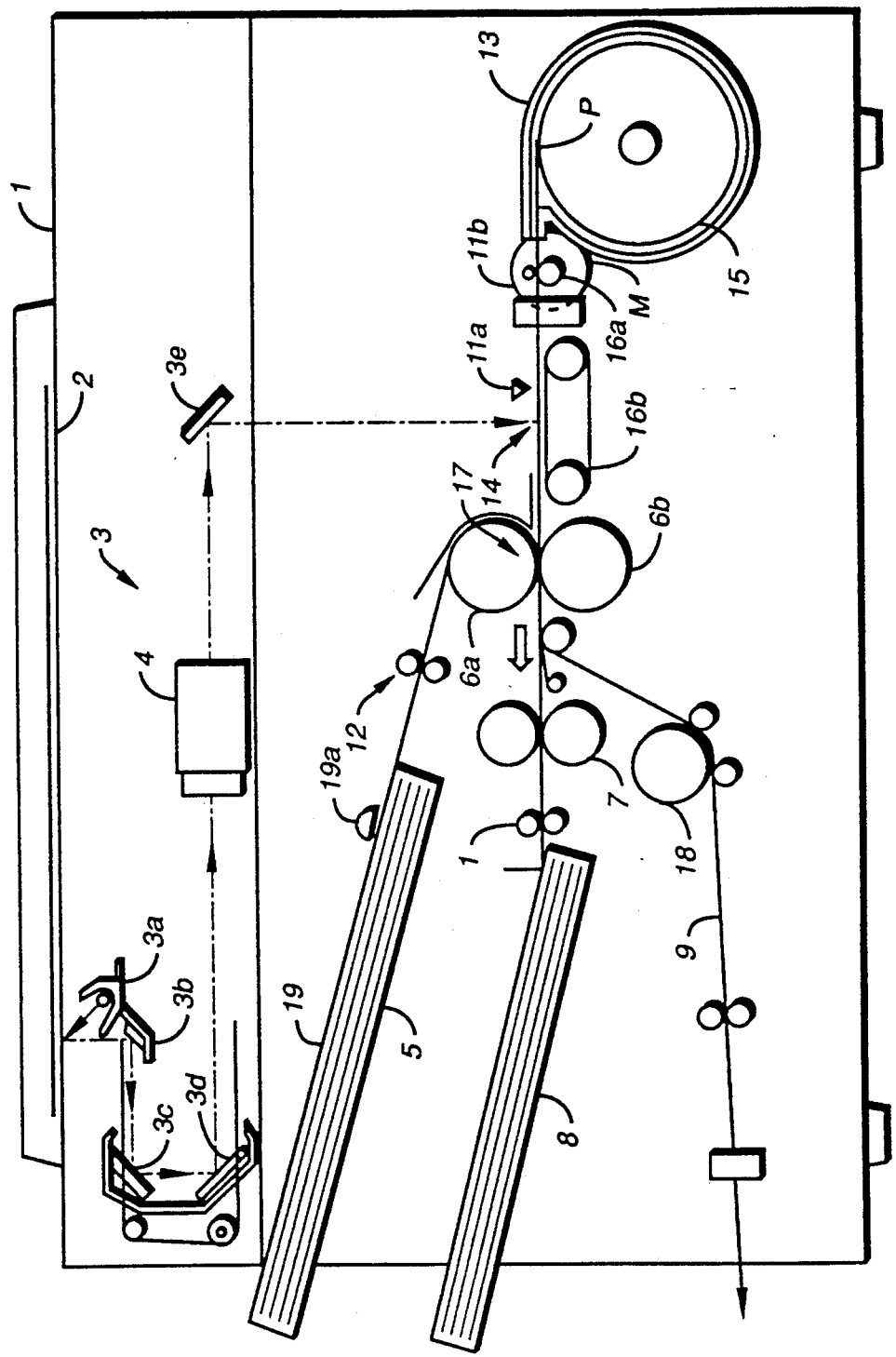
FIG._1

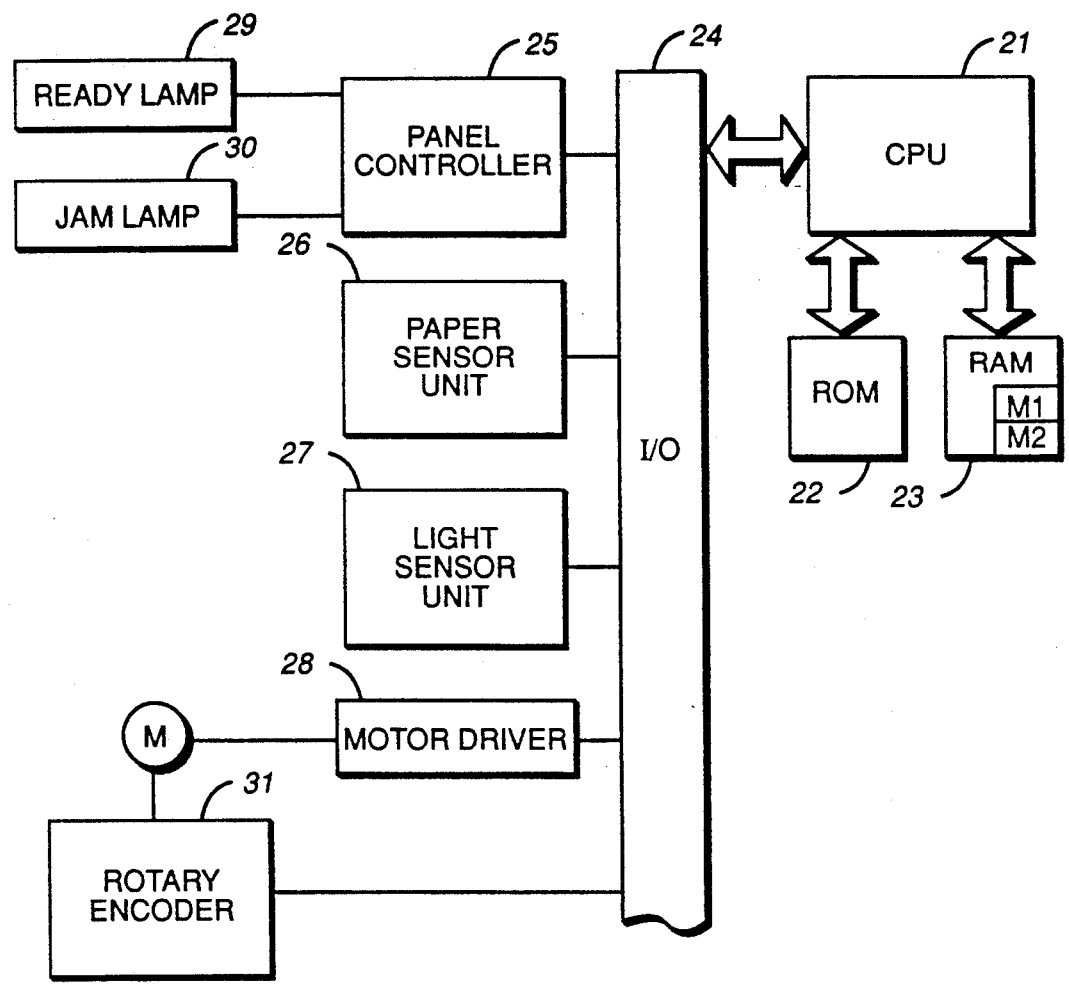
FIG._2

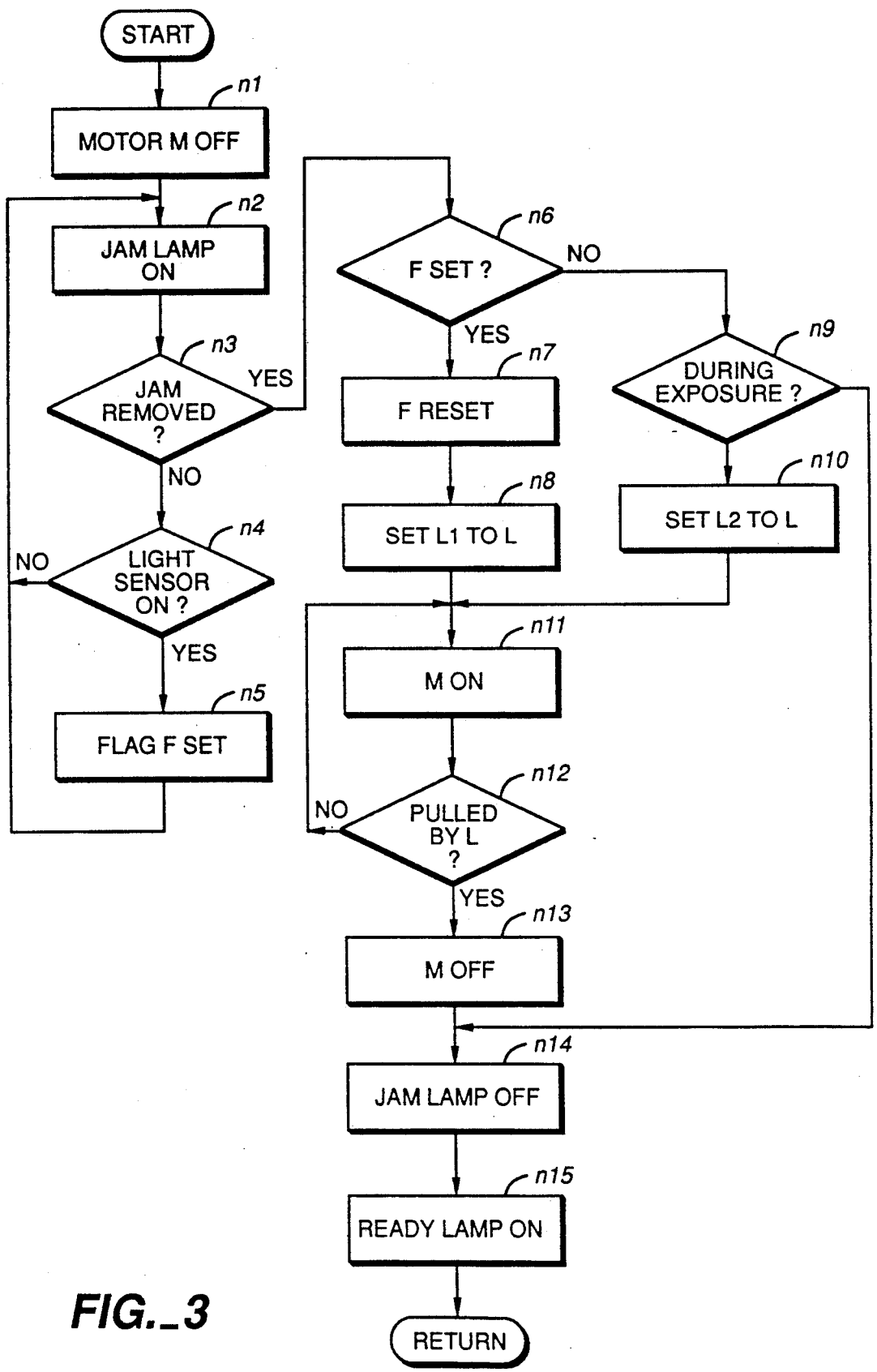
FIG._3

IMAGE FORMING APPARATUS

BACKGROUND OF THE INVENTION

This invention relates to an image forming apparatus which forms images by superposing a photosensitive sheet with one surface coated with microcapsules encapsulating a colorless dye and a light-curable agent which hardens by exposure to light and an image transfer sheet with one surface coated with a developing agent having a chromogenic effect on this colorless dye and pressing them together.

Japanese Patent Publication Tokkai No. 58-88739 discloses a method of forming images by using a photosensitive sheet. The photosensitive sheet used by this method is characterized as having a sheet-like base material coated with microcapsules encapsulating a colorless dye of a specified kind and a light-curable agent which hardens when exposed to light. If a photosensitive sheet like this is exposed to image-forming light such as reflected light from a document, only those of the microcapsules on the sheet which are exposed to light are selectively hardened and a latent image corresponding to the image carried by the light is thereby formed on the photosensitive sheet. If an image transfer sheet with one surface coated with a developing agent having a chromogenic effect on the colorless dye in the microcapsules is superposed on such a photosensitive sheet having a latent image formed thereon and if they are then pressed together, those of the microcapsules which have not been hardened rupture, causing the colorless dye encapsulated therein to flow out thereof and to react with the developing agent on the image transfer sheet to form a visible image corresponding to the latent image.

Inside an apparatus for forming an image by such a method, a photosensitive sheet wound up into the form of a roll is usually stored inside a container at a specified position and kept away from the reach of stray light. After the photosensitive sheet is pulled out of such a container and while it travels inside a light-shielding housing structure, its microcapsule-coated surface is exposed to image-forming light at an exposure position and the photosensitive sheet is thereafter transported to a compression device which serves as a visible image forming device. In the meantime, an image transfer sheet is transported from a paper supply section to this compression device where it is superposed on top of the photosensitive sheet with a latent image formed thereon and these two sheets are pressed together.

Thus, since a latent image is formed on such a photosensitive sheet by exposing its microcapsule-coated surface to image-forming light such that only those of the microcapsules exposed to light should be selectively hardened, it is essential that the microcapsule-coated surface of the photosensitive sheet be exposed only to the image-forming light. In other words, the photosensitive sheet must be completely shielded from external light other than the image-forming light when it is transported inside the apparatus. Inside an image forming apparatus of this kind, however, the photosensitive and image transfer sheets frequently cause a jam. Whenever there is a jam in a paper transporting route, the apparatus must be opened such that the situation can be remedied. The housing structure is also opened for the purpose of maintenance. When the apparatus is opened, however, external light penetrates the interior and a part of the photosensitive sheet which has not been exposed to image-forming light may be exposed to external light. Since this causes the hardening of all microcapsules on the photosensitive sheet inclusive of those at areas where no image is desired, the quality of the image formed thereafter on the image transfer sheet will be significantly affected adversely.

SUMMARY OF THE INVENTION

It is therefore an object of the present invention to eliminate such problems of prior art image forming apparatus by providing an improved apparatus so structured that, even if it is opened to remove a jam or for a maintenance work, the part of the photosensitive sheet thereby exposed to external light will not be used for forming any image and hence the quality of images obtained by the apparatus will not be adversely affected by the opening of its housing structure.

An image forming apparatus embodying the present invention, with which the above and other objects can be achieved, is characterized not only as having a photosensitive sheet with one surface of its sheet-like base material coated with microcapsules encapsulating a light-curable material and a colorless dye which is sequentially and continuously pulled out of a light-shielding container into the interior of its light-shielding housing structure and superposed, after being exposed to image-forming light at an exposure position, with an image transfer sheet with one surface of its sheet-like base material coated with a developing agent having a chromogenic effect on the colorless dye to form an image on the image transfer sheet by compressing the image transfer sheet and the photosensitive sheet together but also as having a means for causing the photosensitive sheet to advance by a specified distance from the exposure position if a jam is detected in the apparatus.

According to a preferred embodiment of the present invention, the distance by which the photosensitive sheet is advanced varies, depending upon whether or not certain specified parts inside the housing structure have been exposed to light or not. According to another preferred embodiment of the present invention, the distance by which the photosensitive sheet is advanced when the aforementioned specified parts have been exposed to light is no less than the distance between the container enclosing the photosensitive sheet therein and the exposure position. According to still another preferred embodiment of the present invention, the distance by which the photosensitive sheet is advanced when the aforementioned specified parts have not been exposed to light is no less than the distance by which the photosensitive sheet at the exposure position is normally advanced for a scan along the direction of its travel.

BRIEF DESCRIPTION OF THE DRAWINGS

The accompanying drawings, which are incorporated in and form a part of the specification, illustrate an embodiments of the present invention and, together with the description, serve to explain the principles of the invention. In the drawings:

FIG. 1 is a schematic front sectional view of an image forming apparatus embodying the present invention, FIG. 2 is a block diagram of a control unit for the image forming apparatus of FIG. 1, and FIG. 3 is a flow chart of the operation of the control unit shown in FIG. 2.

DESCRIPTION OF PREFERRED EMBODIMENTS

With reference to FIG. 1 which schematically shows an image forming apparatus embodying the present invention, a document table 2 made of a transparent hard glass material is formed on the top surface of its housing structure 1 for placing thereon an original document. Below this document table 2 is an optical system 3 comprised of a light source 3a, light source 3a is reflected by the document placed on the document table 2 and, after it is reflected by the mirror 3b which is unistructural with the light source 3a and its direction of propagation is reversed by a pair of mirrors 3c and 3d, projected through the lens 4 onto the mirror 3e which bends the direction of light by 90°, directing it downward to the lower part of the housing structure 1. The light source 3a of the optical system 3 is adapted to reciprocatingly travel below the document table 2, thereby scanning the image on the original document placed thereon. The mirror 3b moves with the light source 3a while the pair of mirrors 3c and 3d is adapted to move in the same direction as but at ½ of the speed of the light source 3a. The light from the source 3a reflected by the document travels as shown by arrows and forms an image, as will be explained more fully below, on a photosensitive sheet 15 at an exposure point 14.

The photosensitive sheet 15 is wound into the form of a roll and stored inside a container 13 disposed at a side part inside the housing structure 1. The photosensitive sheet 15 has a surface of its sheet-like base material coated with microcapsules encapsulating a light-curable agent which hardens upon exposure to light and a colorless dye. The photosensitive sheet 15 inside the container 13 is shielded from external light. After it is pulled out horizontally thereof by means of feed rollers 16a with its microcapsule-coated surface facing upward, it is transported inside the housing structure horizontally by means of a conveyor belt 16b driven by a driving motor M. Carried by this conveyor belt 16b, the photosensitive sheet 15 passes through the exposure point 14 defined above the conveyor belt 16b and is delivered to an image forming position 17 defined between a pair of pressure rollers 6a and 6b which serve as a compression device. After passing through the image forming position 17, the photosensitive sheet 15 is directed by rollers 18 to a discharge section.

Inside the housing structure opposite from the container 13 for the photosensitive sheet 15 is a cassette 5 for containing a plurality of image transfer sheets 19. The image transfer sheets 19 have a surface of their sheet-like base material coated both with a developing agent which reacts chromogenically with the colorless dye encapsulated in the microcapsules on the photosensitive sheet 15 to produce color and with a thermoplastic resin material. These image transfer sheets 19 are transported one sheet at a time by the rotations of a feed roller 19a and timing rollers 12 to an upper part of the upper one of the pressure rollers (6a) and, after moving halfway therearound, delivered to the aforementioned image forming position 17 between the pressure rollers 6a and 6b. The image transfer sheet which has passed the image forming position 17 is directed through heat rollers 7 into a discharge tray 8. The rotary power of the driving motor M is also communicated to the feed rollers 16a.

Along the traveling route of the photosensitive sheet 15 between its container 13 and the exposure position 14, there are light sensors 11a and 11b for detecting the incidence of external light. One of them (11a) is disposed near and on the upstream side of the exposure point 14 with respect to the direction of motion of the photosensitive sheet 15. The other (11b) is disposed near and on the downstream side of the feed rollers 16a with respect to the direction of motion of the photosensitive sheet 15. Although not shown in the figures, sensors for detecting a jam are provided at appropriate positions along the traveling routes of the photosensitive sheet 15 and the image transfer sheet 19. A jammed condition inside the housing structure is adapted to be detected by an output from these detectors.

During an image forming operation of the apparatus, the driving motor M is activated in addition to the main motor (not shown) of the apparatus. This causes & not only the light source 3a and the mirrors 3b-3c of the optical system 3 to move below the document table 2 but also the photosensitive sheet 15 to travel from the container 13 to the image forming position 17 at the same speed. The microcapsule-coated surface of the photosensitive sheet 15 is exposed to the reflected light from the document at the exposure position 14 as the photosensitive sheet 15 travels to the image forming position 17. The microcapsules on the photosensitive sheet 15 are thereby hardened selectively to form a latent image corresponding to the image on the original document. Prior to the scanning operation by the optical system 3, an image transfer sheet 19 is transported from the cassette 5 to the timing rollers 12. When the image transfer sheet 19 comes into contact with the timing rollers 12, it stops at the position temporarily. The timing rollers 12 serve to transport the image transfer sheet from this temporarily stopped position to the image forming position 17 in synchronism with the scanning operation of the optical system 3 and the transportation of the photosensitive sheet 15. At the image forming position 17, the image transfer sheet 19 is compressed together with the photosensitive sheet 15 with the latent image formed thereon such that those of the microcapsules on the photosensitive sheet 15 which have not been hardened are ruptured, causing the colorless dye encapsulated therein to flow out thereof and onto the image transfer sheet 19. The colorless dye then reacts chromogenically with the developing agent coating the image transfer sheet 19 to produce color, thereby forming a visible image on the image transfer sheet 19 corresponding to the image on the scanned document on the document table 2. The image transfer sheet 19 superposed on the photosensitive sheet 15 and compressed therewith at the image forming point 17 is thereafter separated from the photosensitive sheet 15 and directed to the heat rollers 7. The thermoplastic resin material with which the surface of the image transfer sheet 19 is coated melts by the heat from the heat roller 7, providing luster to the produced visible image.

As shown in FIG. 2, the overall control of the image forming apparatus of FIG. 1 is carried out by a central processing unit CPU 21 which is connected through an I/O interface 24 to a panel controller 25, a paper sensor unit 26, an external light sensor unit 27, a motor driver 28, etc. A "ready" lamp 29 and a "jam" lamp 30 on the top surface of the housing structure 1 are connected to the panel controller 25. The "ready" lamp 29 serves to indicate by being on or off whether the apparatus is ready for an image forming operation. The "jam" lamp is for indicating whether a jam has occurred in the traveling route for the photosensitive sheet 15 or the image transfer sheet 19. The paper sensor unit 26 is connected to sensors for detecting the occurrence of a jam in the transfer routes for the photosensitive sheet 15 and the image transfer sheet 19. The external light sensor unit 27 is connected to the aforementioned light sensors 11a and 11b. The motor driver 28 is connected to the driving motor M. A rotary encoder 31 is provided to this motor M for detecting its rotary motion. The CPU 21 controls these input and output devices connected to the I/O interface 24 according to a program preliminarily stored in a read-only memory ROM 22. Specified areas of a random-access memory RAM 23 are used as working areas for this purpose. The CPU 21 is programmed to count the number of pulse signals outputted from the rotary encoder 31 and calculate the distance by which the photosensitive sheet 15 has been moved by the driving motor M.

A mode of operation of the control system of the image forming apparatus described above is explained next by way of a flow chart shown in FIG. 3. When a jam occurs during an image forming operation of the apparatus either due to the photosensitive sheet 15 or an image transfer sheet 19, the "ready" lamp 29 is switched off and the driving motor M is stopped (n1). At the same time, the "jam" lamp 30 is switched on (n2) and the system waits until the jammed condition is removed by an operator (n3). If either of the light sensors 11a and 11b detects external light under this condition (that is, while there is a jammed condition within the apparatus) (YES in n4), a flag F is set in memory area M1 assigned to it. When the jam is removed (YES in n3), the condition of the flag F is immediately checked (n6). If the flag F is found to be set (YES in n6), this means that the photosensitive sheet 15 came to be exposed to external light while the jam was being removed and, after the flag F is reset (n7), the distance $L_1$ between the position (indicated by P in FIG. 1) at which the photosensitive sheet 15 is pulled out of the container 13 and the exposure position 14 is set in memory area M2 of the RAM 23 as the traveling distance L of the photosensitive sheet 15 (n8). If the flag F is found to be reset (NO in n6) after the jam was removed, it is checked whether an image forming operation was going on when the jam occurred (n9). If an image forming operation was going on when the jam occurred (YES in n9), the distance $L_2$ by which the photosensitive sheet 15 is normally advanced in the direction of transportation for a scan is set as the traveling distance L in memory area M2 of the RAM 23 (n10).

If a distance L is thus set after the jam is removed, the driving motor M is operated (n11). The distance traveled thereupon by the photosensitive sheet 15 is monitored by the CPU 21 by receiving pulse signals from the rotary encoder 31 and the driving motor M is stopped (n13) after the photosensitive sheet 15 is found to have traveled the set distance L (YES in n12). The "jam" lamp 30 is thereafter switched off (n14) and the "ready" lamp 29 is switched on. If it is found that the jam occurred before the photosensitive sheet 15 was exposed to image-forming light and that external light did not reach either of the light sensors 11a and 11b (YES in n3, NO in n6 and NO in n9), on the other hand, the driving motor M is not run, the "jam" lamp 30 is switched off (n14) and the "ready" lamp 29 is switched on (n15).

In summary, if the light sensors 11a and 11b indicate that the photosensitive sheet 15 came to be exposed to external light while a jam was being removed, the part of the photosensitive sheet 15 from the position P to the exposure position 14 is assumed exposed and completely removed so as not to be used in the next image forming operation. Even in a situation where the light sensors 11a and 11b indicate that the photosensitive sheet 15 was not exposed to external light, however, the photosensitive sheet 15 is advanced by the normal distance of travel corresponding to a scan if the jam occurred while the optical system 3 was being operated or after the photosensitive sheet 15 has been exposed to image forming light. Thus, the present invention serves to prevent double exposure of microcapsules on the photosensitive sheet 15 when a jam is removed. Moreover, since judgments are based on determinations whether the light sensors 11a and 11b indicate that the photosensitive sheet 15 may have been exposed to external light and whether it may have been exposed to image forming light from the optical system 3, the photosensitive sheet 15 is advanced only to the extent of removing the exposed part. In other words, wasting of unexposed parts of the photosensitive sheet can be prevented according to the present invention.

The foregoing description of a preferred embodiment of the invention has been presented for purposes of illustration and description. It is not intended to be exhaustive or to limit the invention to the precise form disclosed, and many modifications and variations are possible in light of the above teaching. Any such modifications and variations that may be apparent to a person skilled in the art are intended to be included within the scope of this invention.

What is claimed is:

1. In an image forming apparatus which comprises a light-shielding housing structure and a light-shielding container disposed inside said housing structure and forms an image by storing a photosensitive sheet inside said light-shielding container, said photosensitive sheet having one surface of sheet-like base material thereof coated with microcapsules encapsulating a light-curable agent and a colorless dye, pulling said photosensitive sheet sequentially and continuously out of said container inside said light-shielding housing structure, thereafter exposing said photosensitive sheet to image-forming light at an exposure position, superposing on said photosensitive sheet an image transfer sheet having one surface of sheet-like base material thereof coated with a developing agent having a chromogenic effect on said colorless dye and compressing said photosensitive sheet and said image transfer sheet together to form a visible image on said image transfer sheet, the improvement wherein said image forming apparatus further comprises detecting means for detecting, when said image forming apparatus detects a jammed condition of either said photosensitive sheet or said transfer sheet inside said housing structure, whether said photosensitive sheet has been exposed to external light outside said container, and means for transporting said photosensitive sheet by a specified distance from said exposure position after said jammed condition is removed, said specified distance being determined according to the result of detection by said detecting means.

2. The image forming apparatus of claim 1 wherein said specified distance, if said detecting means detects that said photosensitive sheet was exposed to external light, is at least equal to the distance between said container and said exposure position.

3. The image forming apparatus of claim 1 wherein said specified distance, if said detecting means detects that said photosensitive sheet was not exposed to external light, is at least equal to the distance in the direction of motion of said photosensitive sheet across the area over which said photosensitive sheet is normally exposed to said image-forming light at said exposure position.

4. The image forming apparatus of claim 1 wherein said detecting means include light sensors at upstream and downstream sides of said exposure position with respect to the direction of motion of said photosensitive sheet at said exposure position.

* * * * *